United States Patent [19]

Suzuki et al.

[11] 4,065,187

[45] Dec. 27, 1977

[54] SEMICONDUCTOR LATCH CIRCUIT USING INTEGRATED LOGIC UNITS AND SCHOTTKY DIODE IN COMBINATION

[75] Inventors: Yasoji Suzuki, Ayase; Yukuya Tokumaru; Masanori Nakai, both of Yokohama, all of Japan

[73] Assignee: Tokyo Shibaura Electric Co., Ltd., Tokyo, Japan

[21] Appl. No.: 746,159

[22] Filed: Nov. 30, 1976

[30] Foreign Application Priority Data

Dec. 1, 1975  Japan .................................. 50-142180

[51] Int. Cl.² .......................................... H03K 3/286
[52] U.S. Cl. .................................... 307/279; 307/213; 307/247 R; 307/288; 307/299 B; 307/317 A; 357/15

[58] Field of Search .................. 307/317 A, 213, 215, 307/247 R, 279, 288, 299 B; 357/15

[56] References Cited

U.S. PATENT DOCUMENTS

| 3,909,807 | 9/1975 | Fulton ................................. 357/15 X |
| 3,961,351 | 6/1976 | Blatt ........................................ 357/15 |
| 3,969,632 | 7/1976 | Bobenrieth ........................... 307/213 |

Primary Examiner—John S. Heyman
Attorney, Agent, or Firm—Finnegan, Henderson, Farabow & Garrett

[57] ABSTRACT

A semiconductor latch circuit formed of a plurality of integrated injection logic (abbreviated as "IIL") units each comprising a switching transistor acting as a switching element and an injector transistor acting as an injector, wherein a Schottky diode is connected to the base of the switching transistor.

14 Claims, 31 Drawing Figures

FIG. 7C $\overline{ST}$

FIG. 7F $\overline{OUT}$

FIG. 7G OUT

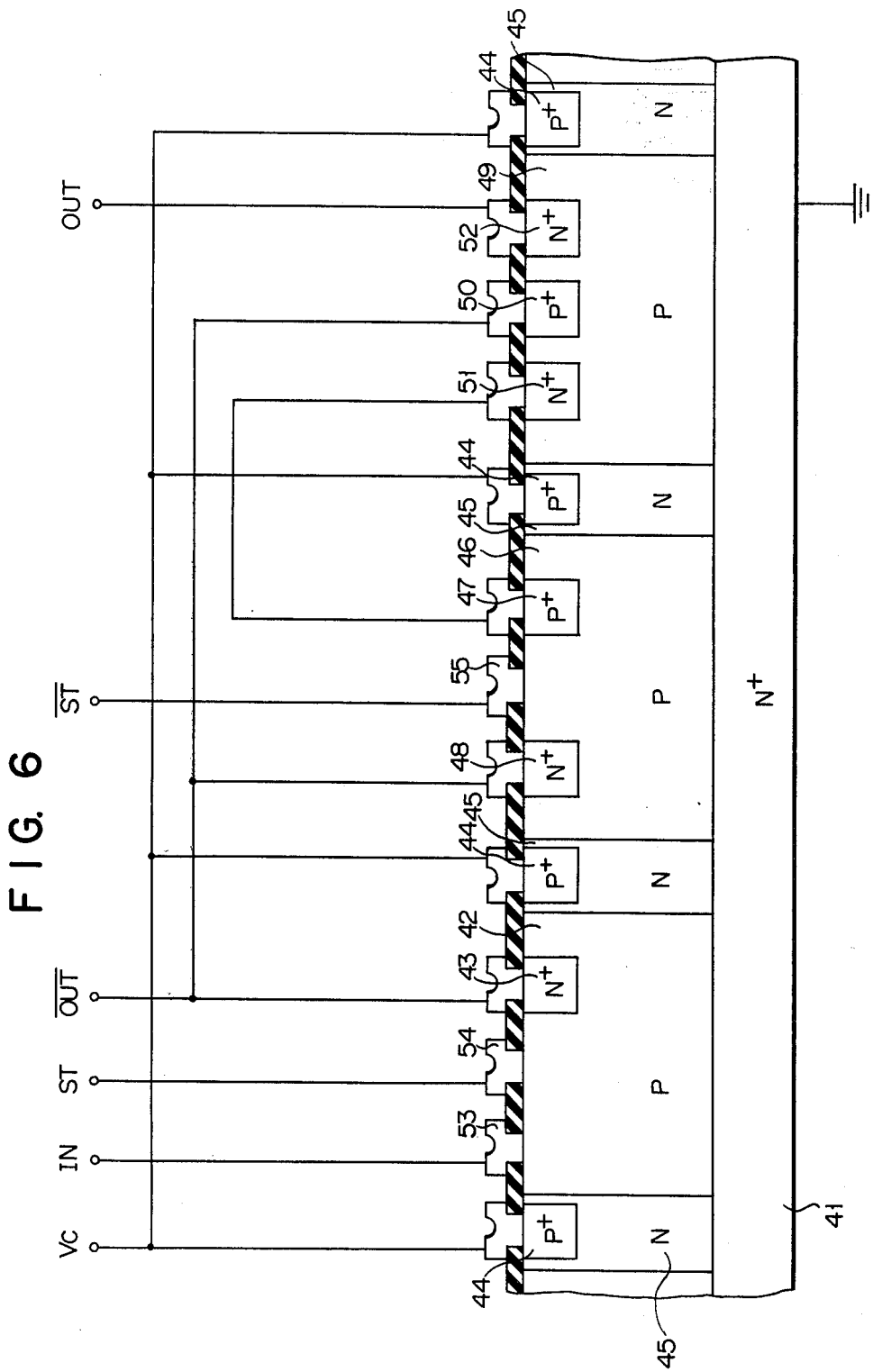

FIG. 11A IN
FIG. 11B $\overline{ST}$
FIG. 11C X
FIG. 11D Y
FIG. 11E $\overline{OUT}$
FIG. 11F OUT

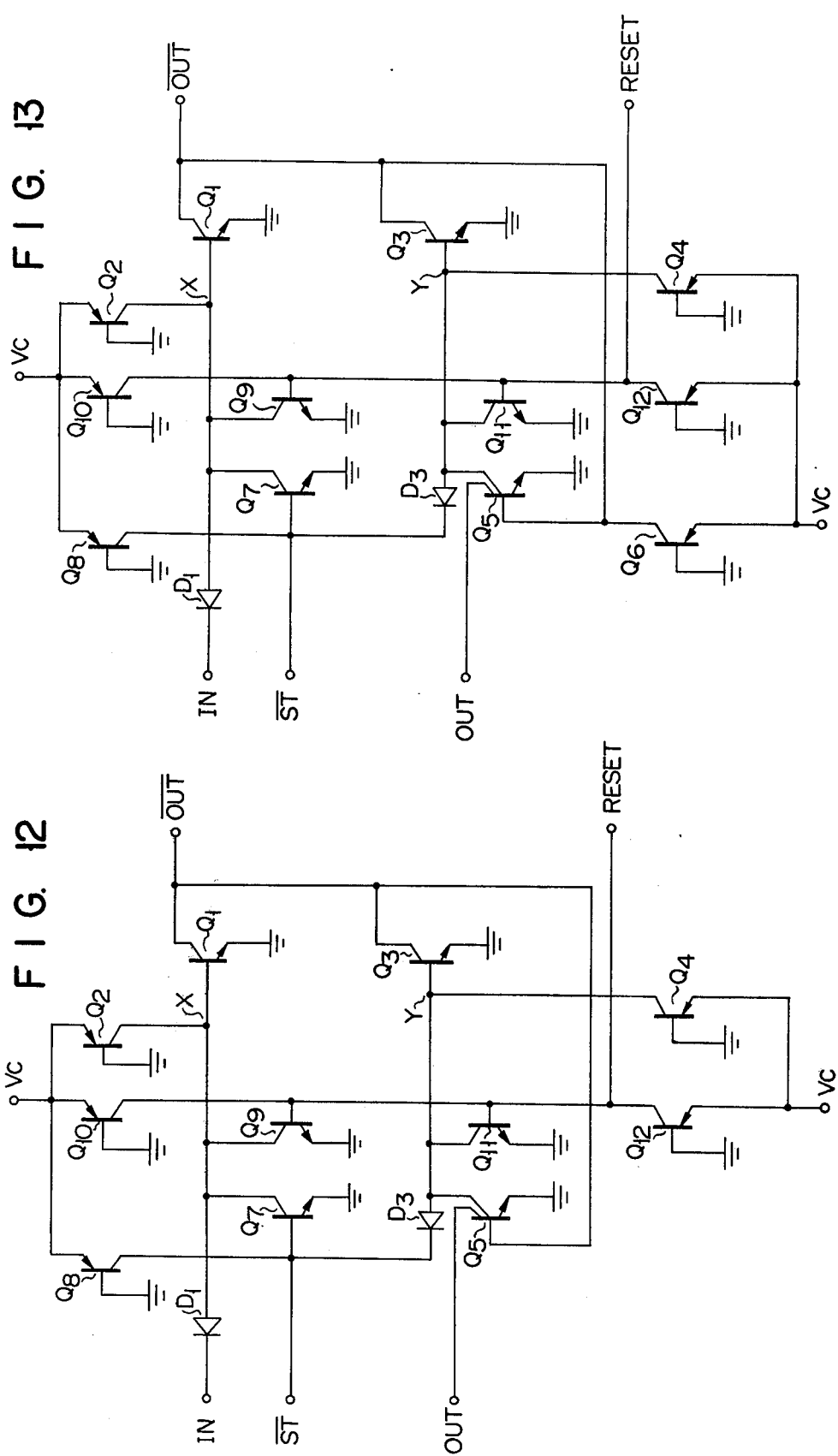

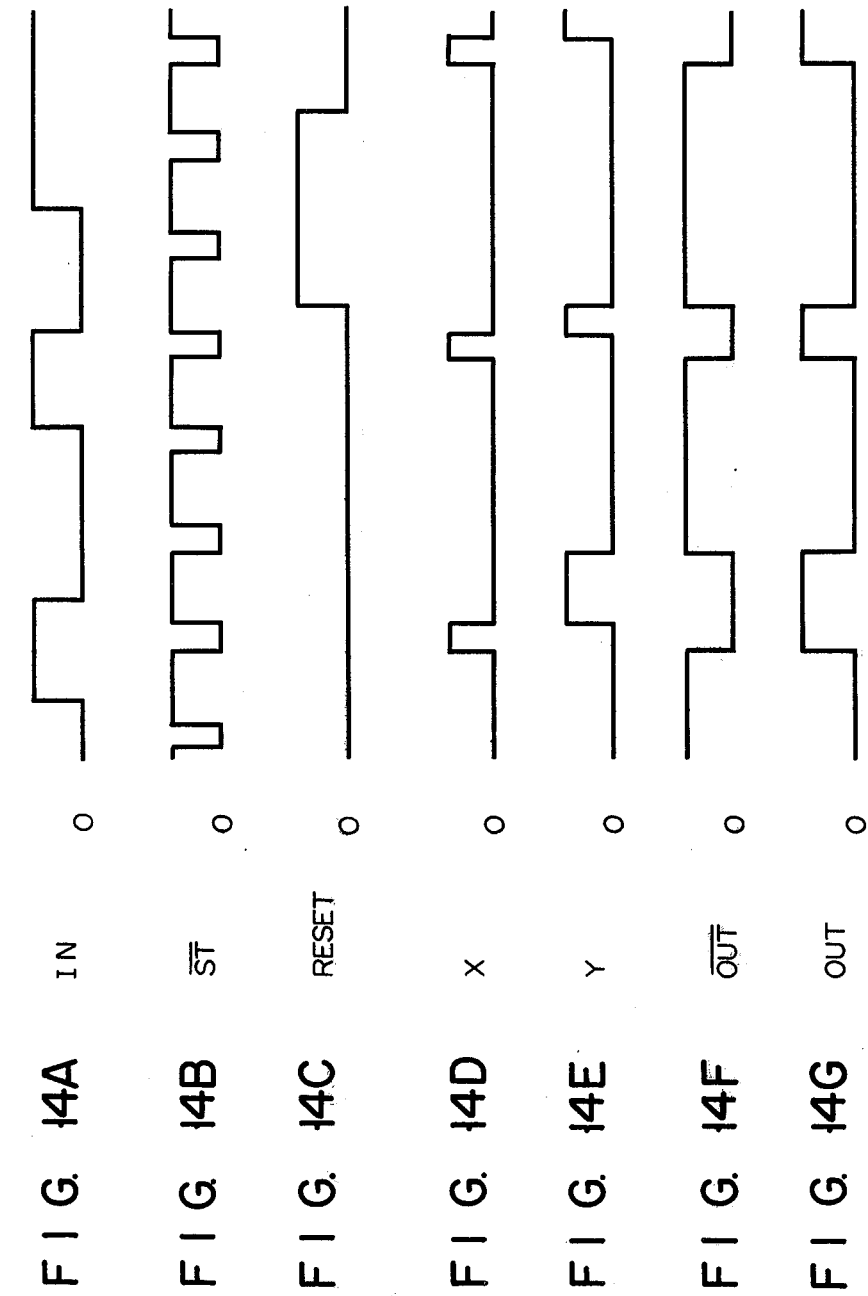

4,065,187

SEMICONDUCTOR LATCH CIRCUIT USING INTEGRATED LOGIC UNITS AND SCHOTTKY DIODE IN COMBINATION

This invention relates to a semiconductor latch circuit formed of IIL units.

The IIL unit is a logic unit which has two transistors formed in a single semiconductor body, that is, a transistor acting as a switching element (hereinafter referred to as "a switching transistor") and a transistor acting as an injector for injecting minority carriers into the switching transistor (hereinafter referred to as "an injector transistor"), and functions as an inverter as a whole.

FIG. 1 shows the construction of the IIL unit. FIG. 2 is an equivalent circuit thereof. A switching transistor $Q_1$ is formed of a N+ layer 1, N− layer 2, P layer 3 and $N^{30}$ layer 4. An injector transistor $Q_2$ comprises a P+ layer 5, P layer 6, N− layer 2, P layer 3 and P+ layer 7. FIG. 3 shows the prior art latch circuit which comprises an IIL unit formed of a switching transistor $Q_1$ and an injectortransistor $Q_2$ for injecting minority carriers into the base region of said switching transistor $Q_1$; an IIL unit formed of a switching transistor $Q_3$ and an injector transistor $Q_4$ for injecting minority carriers into the base region of said switching transistor $Q_3$; a switching transistor $Q_5$ whose collector is connected to the base of said switching transistor $Q_1$, and whose base is connected to a signal input terminal $IN_1$ of said latch circuit; a switching transistor $Q_6$ whose collector is connected to the base of said switching transistor $Q_1$ and whose base is connected to a signal input terminal $IN_2$ of the latch circuit; a switching transistor $Q_7$ whose collector is connected to the base of said switching transistor $Q_3$ and whose base is connected to a signal input terminal $IN_3$; and a switching transistor $Q_8$ whose collector is connected to the base of said switching transistor $Q_3$ and whose base is connected to the collector of said switching transistor $Q_1$.

The conventional latch circuit is formed of a semiconductor device illustrated in FIG. 4. The switching transistor $Q_1$ comprises a N+ layer 11, N− layer 12, P layer 13, and N+ layer 14. The injector transistor $Q_2$ is formed of a P+ layer 15, P layer 16, N− layer 12, P layer 13, and P+ layer 17. The switching transistor $Q_3$ comprises a N+ layer 11, N− layer 12, P layer 18 and N+ layer 19. The injector transistor $Q_4$ is formed of a P+ layer 15, P layer 16, N− layer 12, P layer 18 and P+ layer 20. The switching transistor $Q_5$ comprises a N− layer 11, N− layer 12, P layer 21, P+ layer 22 and N+ layer 23. The switching transistor $Q_6$ is formed of a N+ layer 11, N− layer 12, P layer 24, P+ layer 25 and N+ layer 26. The switching transistor $Q_7$ comprises a N+ layer 11, N− layer 12, P layer 27, P+ layer 28 and N+ layer 29. The switching transistor $Q_8$ is formed of a N+ layer 11, N− layer 12, P layer 30, P+ layer 31 and N+ layer 32.

The conventional latch circuit comprises as many as six switching transistors $Q_1, Q_3, Q_5, Q_6, Q_7, Q_8$. As apparent from FIG. 2, this means that six switching transistor bases have to be formed on the surface of a semiconductor body. However, provision of such numerous switching transistor bases occupies a considerable area on the surface of the semiconductor body, presenting difficulties by forming a large scale integrated circuit for which high integration is demanded.

It is accordingly the object of this invention to provide a semiconductor latch circuit adapted for high integration.

According to an aspect of this invention, there is provided a latch circuit which comprises a plurality of IIL units each formed of an injector transistor and switching transistor and a Schottky diode connected to the base of the switching transistor.

This invention can be more fully understood from the following detailed description when taken in conjunction with the accompanying drawings, in which:

FIG. 1 shows the structure of an IIL unit;

FIG. 2 presents an equivalent circuit of the IIL unit of FIG. 1;

FIG. 3 indicates the arrangement of the prior art latch circuit;

FIG. 4 sets forth the structure of a semiconductor constituting the prior art latch circuit;

FIG. 6 illustrates the structure of a semiconductor constituting the present latch circuit of FIG. 5;

Figure 1:
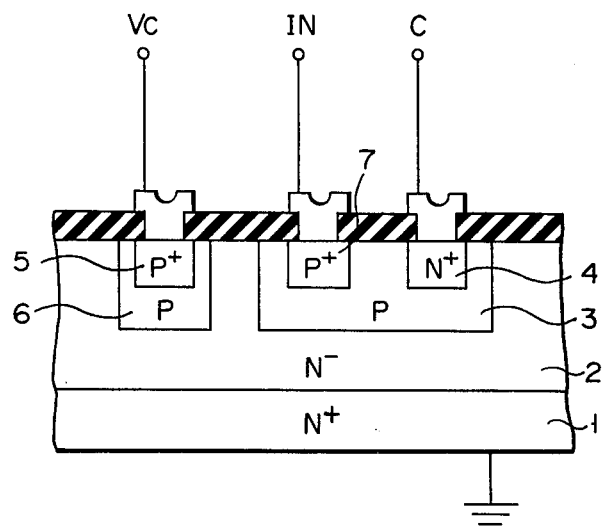
Figure 2:
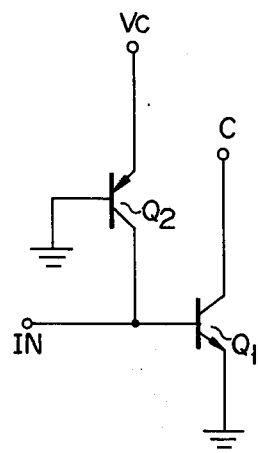
Figure 3:
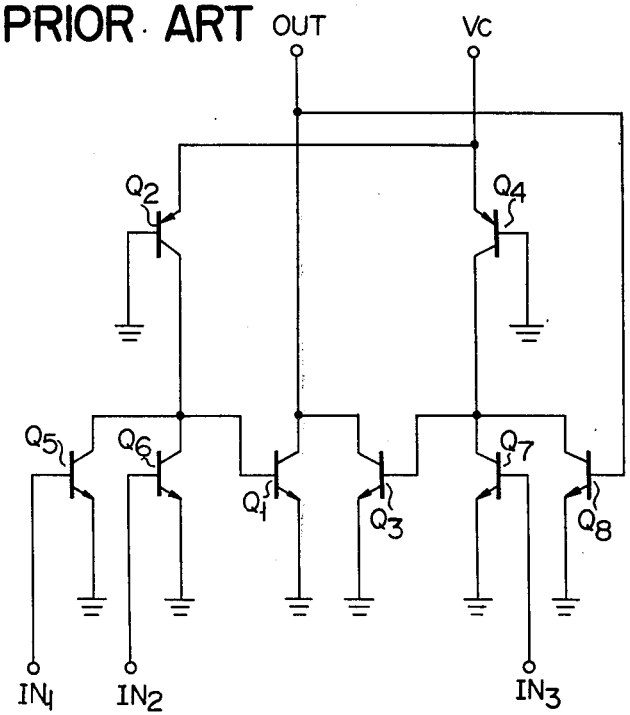
Figure 4:
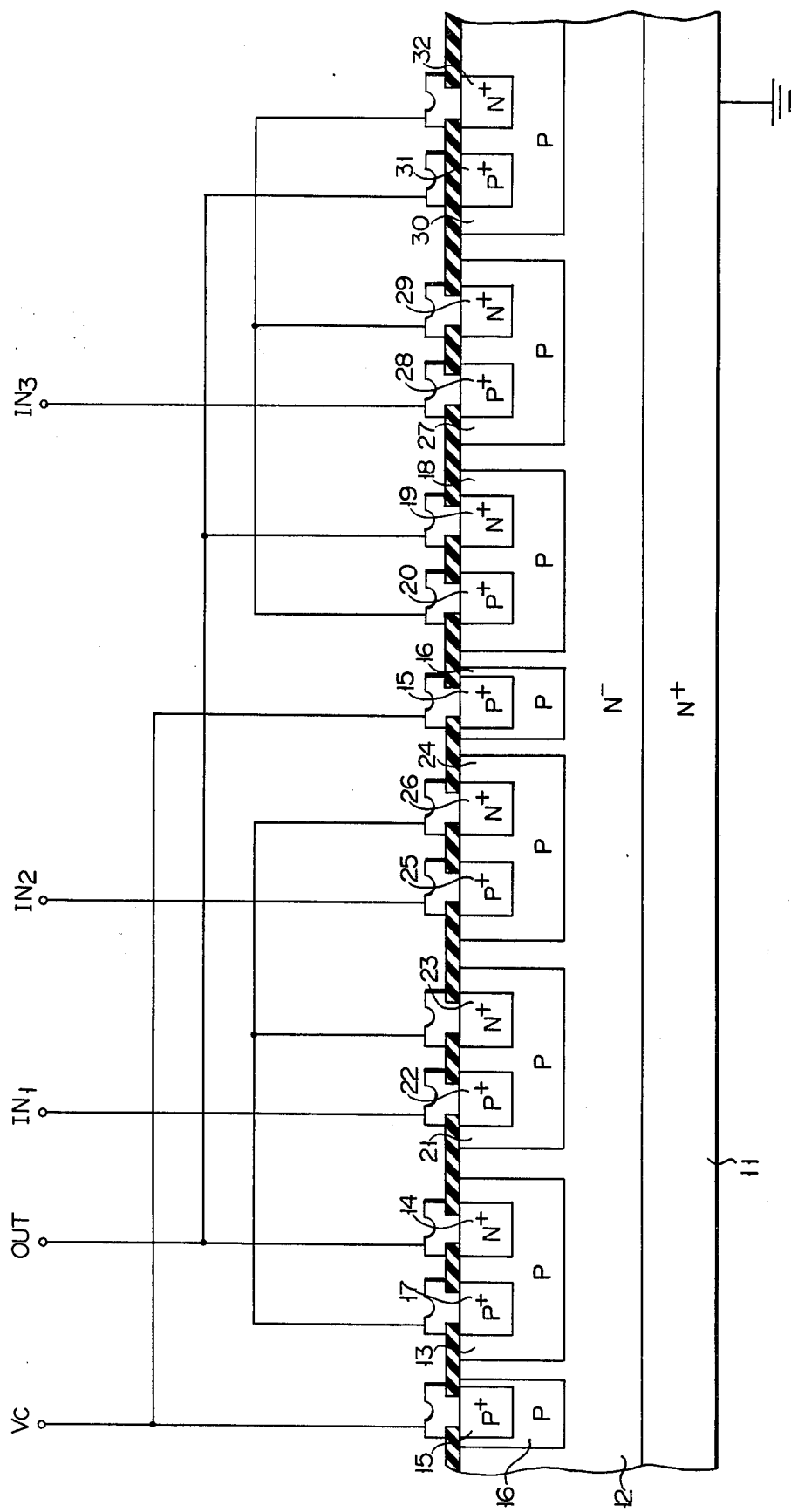
Figure 5:
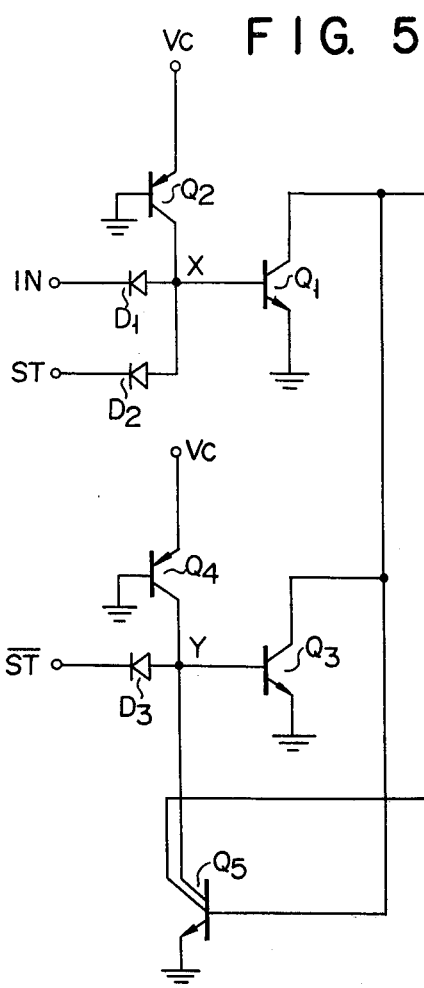
FIG. 5 shows the arrangement of a latch circuit according to one embodiment of this invention.
Figure 8:
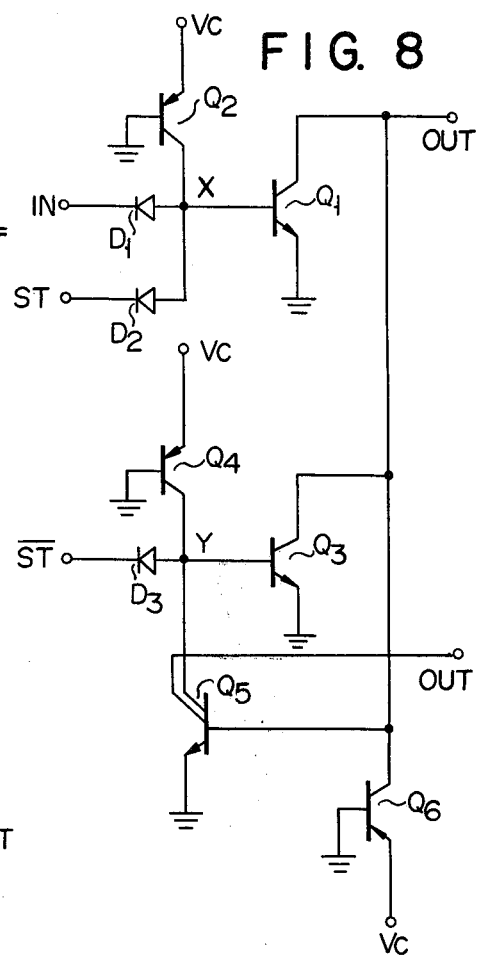
Figures 9, 10:
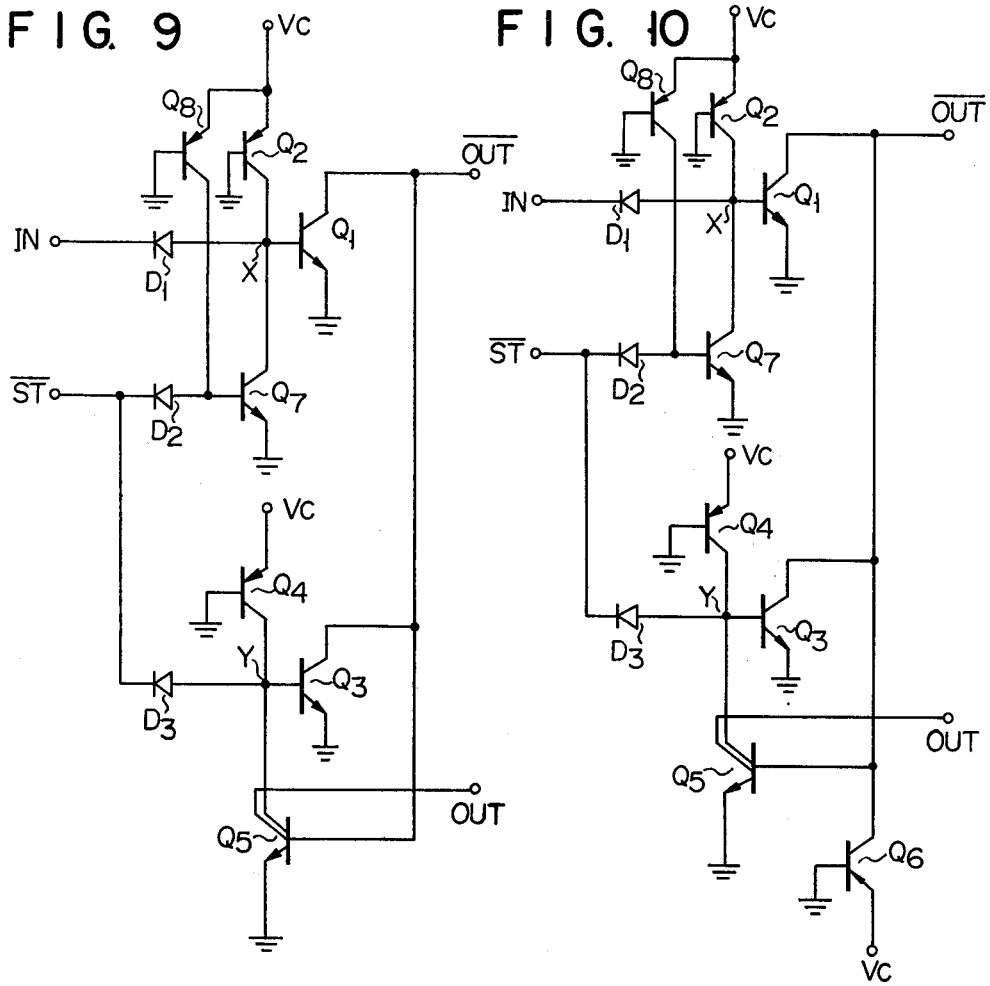

FIGS. 7(A) to 7(G) show the waveforms of signals in the various sections of the present latch circuit of FIG. 5;

FIG. 8 indicates the arrangement of a latch circuit according to another embodiment of the invention;

FIG. 9 presents the arrangement of a latch circuit according to still another embodiment of the invention;

FIG. 10 sets forth the arrangement of a latch circuit according to a further embodiment of the invention;

FIGS. 11(A) to 11(F) show the waveforms of signals in the various sections of the latch circuits of FIGS. 9 and 10;

FIGS. 12 and 13 indicate latch circuits according to still further embodiments of the invention; and FIGS. 14(A) to 14(G) show the waveforms of signals in the various sections of the latch circuits of FIGS. 12 and 13.

There will now be described by reference to FIG. 5 a semiconductor latch circuit according to a first embodiment of this invention. This latch circuit comprises one IIL unit formed of a switching transistor $Q_1$ and an injector transistor $Q_2$; another IIL unit formed of a switching transistor $Q_3$ and an injector transistor $Q_4$; a switching transistor $Q_5$ whose base is connected to the collectors of said switching transistors $Q_1, Q_3$ and whose first collector is connected to the base of the switching transistor $Q_3$ and whose second collector a connected to the output terminal OUT of the subject latch circuit; a diode $D_1$ whose cathode side is connected to a pulse signal input terminal IN supplied with a pulse signal being latched and whose anode side is connected to the base of the switching transistor $Q_1$; a diode $D_2$ whose cathode side is connected to an input terminal ST supplied with a strobe signal for providing a timing in which the pulse signal is to be issued and whose anode side is connected to the base of the switching transistor $Q_1$; and a diode $D_3$ whose cathode side is connected to another input terminal $\overline{ST}$ supplied with a strobe signal of opposite phase to the aforesaid strobe signal and whose anode side is connected to the base of the switching transistor $Q_3$. The latch circuit of FIG. 5 is formed of a semiconductor device of FIG. 6.

As apparent from FIG. 6, the switching transistor $Q_1$ is formed of a N+ layer 41, P layer 42, and N+ layer 43. The injector transistor $Q_2$ comprises a P+ layer 44, N layer 45, and P layer 42. The switching transistor $Q_3$ is formed of a N+ layer 41, P layer 46, P+ layer 47 and N+ layer 48. The injector transistor $Q_4$ comprises a P+ layer 44, N+ layer 45, and P layer 46. The switching transistor $Q_5$ is formed of a N+ layer 41, P layer 49, P+ layer 50, N+ layer 51 and N+ layer 52. The diode $D_1$ is provided on a contact plane between an electrode 53 connected to the input terminal IN and P layer 42. The diode $D_2$ is formed on a contact plane between an electrode 54 connected to the input terminal ST and P layer 42. The diode $D_3$ is formed on a contact plane between an electrode 55 connected to the input terminal $\overline{ST}$ and P layer 46.

There will now be described the logic operation of the above-mentioned latch circuit (FIG. 6) by reference to FIGS. 7(A) to 7(G) indicating the waveforms of signals in the various sections of said circuit. These figures respectively illustrate the waveforms of a pulse signal to be latched at the input terminal IN; a first strobe signal at the input terminal ST which provides a timing in which the pulse signal is to be issued; a second strobe signal at the input terminal $\overline{ST}$ which has an opposite phase to the aforesaid strobe signal; a signal at position X; a signal at position Y; a signal at the output terminal $\overline{OUT}$; and a signal at the output terminal OUT.

1. Where the pulse signal at the input terminal IN has a lever of "1" and a strobe signal at the input terminal ST is shifted to a level of "1" (at time $t_1$), then the diodes $D_1$, $D_2$ are rendered nonconductive and in consequence a signal at the base of the switching transistor $Q_1$, that is, at the position X has a level of "1". Thus, said switching transistor $Q_1$ becomes operative, and a signal at the output terminal $\overline{OUT}$ has a level of "0". Since a strobe signal at the input terminal $\overline{ST}$ is shifted to a level of "0", the diode $D_3$ is put into operation. Thus, a signal at the base of the switching transistor $Q_3$, that is, at the position Y has a level of "0", rendering said switching transistor $Q_3$ nonconductive. Since a signal at the output terminal $\overline{OUT}$ has a level of "0", the switching transistor $Q_5$ becomes inoperative. As a result, a signal at the output terminal OUT has a level of "1".

2. Where the pulse signal at the input terminal IN has a level of "1" and a strobe signal at the input terminal ST is shifted to a level of "0" (at time $t_2$), then the diode $D_1$ remains nonconductive, but the diode $D_2$ becomes operative. As the result, a signal at the position X has a level of "0", and the switching transistor $Q_1$ is rendered nonconductive. Since a strobe signal at the input terminal $\overline{ST}$ has a level of "b" and the switching transistor $Q_5$ is kept nonconductive, a signal at the position Y has a level of "1", and the switching transistor $Q_3$ is put into operation. As the result, a signal at the output terminal $\overline{OUT}$ is kept at a level of "0", and a signal at the output terminal OUT is kept at a level of "1".

3. Where a pulse signal at the input terminal IN has a level of "1" and a strobe signal at the input terminal ST is shifted to a level of "0" (at time $t_3$), then the diode $D_2$ becomes inoperative, but the diode $D_1$ is rendered conductive. Accordingly, a signal at the position X has a level of "0" and the switching transistor $Q_1$ becomes inoperative. Since a strobe signal at the input terminal $\overline{ST}$ is shifted to a level of "0", the diode $D_3$ is put into operation and a signal at the position Y has a level of "0", rendering the switching transistor $Q_3$ nonconductive, and causing a signal at the output terminal $\overline{OUT}$ to have a level of "1". Since the switching transistor $Q_5$ becomes conductive, a signal at the output terminal OUT has a level of "0".

4. Where a pulse signal at the input terminal IN has a level of "0" and a strobe signal at the input terminal ST is shifted to a level of "0" (at time $t_4$). Then the diodes $D_1$, $D_2$ are rendered conductive and a signal at the position X is kept at a level of "0", rendering the swtiching transistor $Q_1$ nonconductive. Though a signal at the position Y should have a level of "1" because a strobe signal at the input terminal $\overline{ST}$ is shifted to a level of "1", yet said signal is kept at a level of "0" because the switching transistor $Q_5$ is rendered conductive. As the result, the switching transistor $Q_3$ becomes nonconductive, a signal at the output terminal $\overline{OUT}$ is kept at a level of "1", and a signal at the output terminal OUT is kept at a level of "0".

The above-mentioned logic operation causes signals having waveforms of FIGS. 7(F) and 7(G) to be generated at the output terminal $\overline{OUT}$ and OUT with respect to an input signal having a waveform of FIG. 7(A).

As seen from the foregoing description given by reference to FIGS. 5 and 7, this invention provides a semicodncutor latch circuit of simple arrangement which is formed of a plurality of IIL units and a Schotty diode connected to the base of a switching transistor used with the IIL unit, and consequently is particularly adapted to provide a large scale integrated circuit for which high integration is demanded.

There will now be described some other embodiments of the present semiconductor latch circuit. Since these embodiments have the same fundamental function as those already described by reference to FIGS. 7(A) to 7(G), reference is only made for convenience to the parts of said other embodiments which are different from those of the previously mentioned embodiments.

The embodiment of FIG. 8 includes an injector transistor $Q_6$ constituting an IIL unit together with the switching transistor $Q_5$ in order to supply current to the base of said transistor $Q_5$. Signals in the various sections of the embodiment of FIG. 8 have the same waveforms as those shown in FIGS. 7(A) to 7(G).

The embodiment of FIG. 9 makes it unnecessary to supply a strobe signal to the input terminal $\overline{ST}$ in FIG. 8. This embodiment further includes another IIL unit disposed between the base of the switching transistor $Q_1$ and diode $D_2$ of FIG. 8. This additional IIL unit is formed of a switching transistor $Q_7$ and injector transistor $Q_8$. The base of the switching transistor $Q_7$ is connected to the anode side of the diode $D_2$, the collector thereof is connected to the base of the switching transistor $Q_1$ and the emitter thereof is connected to the ground. The cathode side of the diode $D_3$ is connected to the input terminal $\overline{ST}$.

The embodiment 10 further includes an injector transistor $Q_6$ which constitutes an IIL unit jointly with the switching transistor $Q_5$ of FIG. 9.

In FIGS. 9 and 10, the IIL unit formed of the switching transistor $Q_7$ and injector transistor $Q_8$ is connected between the diode $D_2$ and the base of the switching transistor $Q_1$. Obviously, said IIL unit may be connected between the diode $D_3$ and switching transistor $Q_3$.

FIGS. 11(A) to 11(F) show the waveforms of signals in the various sections of the embodiments of the present latch circuit shown in FIGS. 9 and 10 respectively. Said FIGS. 11(A) to 11(F) respectively show the waveforms of a pulse signal at the input terminal IN; a strobe signal at the input terminal $\overline{ST}$; a signal at the base of the switching transistor $Q_1$, that is, the position X; a signal at the base of the switching transistor $Q_3$, that is, the position Y; a signal at the output terminal $\overline{OUT}$; and a signal at the output terminal OUT.

The embodiment of FIG. 12 contains an IIL unit formed of a switching transistor $Q_9$ and injector transistor $Q_{10}$, and another IIL unit formed of a switching transistor $Q_{11}$ and injector transistor $Q_{12}$ in addition to that of the embodiment of FIG. 9. With the embodiment of FIG. 12, the collector of the switching transistor $Q_9$ is connected to the base of the switching transistor $Q_1$, and the base of said transistor $Q_9$ is connected to the reset terminal of the subject latch circuit. The collector of the switching transistor $Q_1$ is connected to the base of the switching transistor $Q_3$, and the base of said transistor $Q_{11}$ is connected to the reset terminal of the subject latch circuit. In the embodiment of FIG. 12, the diode $D_2$ is omitted.

The embodiment of FIG. 13 further comprises an injector transistor $Q_6$ so as to constitute an IIL unit jointly with the switching transistor $Q_5$ of the embodiment of FIG. 12.

FIGS. 14(A) to 14(G) indicate the waveforms of signals in the various sections of a latch circuit according to the embodiments of FIGS. 12 and 13, that is, a signal at the input terminal IN; a strobe signal at the input signal $\overline{ST}$; a strobe signal at the reset terminal; a signal at the base of the switching transistor $Q_1$, that is, the position X; a signal at the base of the switching transistor $Q_3$, that is, the position Y; a signal at the output terminal $\overline{OUT}$; and a signal at the output terminal OUT.

As apparent from FIGS. 14(A) to 14(G), the embodiments of FIGS. 12 and 13 are provided with a reset circuit comprising an IIL unit formed of the switching transistor $Q_9$ and injector transistor $Q_{10}$ and another IIL unit formed of the switching transistor $Q_{11}$ and injector transistor $Q_{12}$, making it possible to reset a signal at the output terminal OUT to a level of "0", regardless of the level of a signal at the input terminal IN and that of a signal at the input terminal $\overline{ST}$. Namely, a signal at the output terminal OUT is reset in synchronization with the rise of a reset signal. Ovbiously, the above-mentioned reset circuit can also be used with the embodiments of FIGS. 5, 8, 9 and 10.

With all the foregoing embodiments, the switching transistor was of the NPN type and the injector transistor was of the PNP type. Of course, these types may be reversed. In such case, however, the anode should be referred to as a cathode, and the cathode as an anode.

What we claim is:

1. A semiconductor latch circuit operative with a power source comprising a first integrated injection logic unit formed of a first switching transistor and a first injector transistor; a second integrated injection logic unit formed of a second switching transistor and a second injector transistor; an output signal leading-out transistor having first and second collectors; an input terminal for receiving a pulse signal to be latched; a first Schottky diode connected between the base of the first switching transistor and said input terminal; strobe signal input means operatively connected to the respective bases of said first and second switching transistors for providing strobe signals thereto; an output terminal connected to the first collector of the output signal leading-out transistor; wherein the emitters of the first and second injector transistors are connected to the power source; the collector of the first injector transistor and the collector of the second injector transistor are connected to the bases of the first and second switching transistors, respectively; the bases of the first and second injector transistors are connected to a reference potential; the collectors of the first and second switching transistors are connected to the base of the output signa leading-out transistor; the emitters of the first and second switching transistors are connected to the reference potential; the second collector of the output signal leading-out transistor is connected to the base of the second switching transistor; and said first Schottky diode is rendered nonconductive when a pulse signal supplied to the pulse signal input terminal has a level of "1".

2. A semiconductor latch circuit according to claim 1 further including a third injector transistor which constitutes a third integrated injection logic unit jointly with the output leading-out transistor; the collector, emitter and base of the third injector transistor being connected respectively to the base of the output leading-out transistor, the power source and the reference potential.

3. A semiconductor latch circuit according to claim 1 wherein said strobe signal input means comprises a first strobe signal input terminal connected to the base of the first switching transistor for supplying a first strobe signal thereto and provide the timing in which said pulse signal should be issued and a second strobe signal input terminal connected to the base of the second switching transistor for supplying a second strobe signal thereto, having an opposite phase to said first strobe signal.

4. A semiconductor latch circuit according to claim 3 further including a third injector transistor which constitutes a third integrated injection logic unit jointly with the output leading-out transistor; the collector, emitter and base of the third injector transistor being connected respectively to the base of the output leading-out transistor, the power source and the reference potential.

5. A semiconductor latch circuit according to claim 3 further including a second Schottky diode connected between the base of the first switching transistor and the first strobe input terminal and a third Schottky diode connected between the base of the second switching transistor and the second strobe signal input terminal, wherein the second Schottky diode is rendered nonconductive when a pulse signal supplied to the first strobe signal input terminal has a level of "1" and the third Schottky diode becomes nonconductive when a pulse signal supplied to the second strobe signal input terminal has a level of "1".

6. A semiconductor latch circuit according to claim 5 further including a third injector transistor which constitutes a third integrated injection logic unit jointly with the output leading-out transistor; the collector, emitter and base of the third injector transistor being connected respectively to the base of the output leading-out transistor, the power source and the reference potential.

7. A semiconductor latch circuit according to claim 1 further including a third integrated injection logic unit formed of a third switching transistor and a third injector transistor, the emitter, collector and base of the third injector transistor being connected to the power source, the base of the third switching transistor and the reference potential, respectively, and the emitter, collector and base of the third switching transistor being connected to the reference potential, the base of the first switching transistor and the strobe signal input means, respectively, said strobe signal input means comprising a strobe signal input terminal connected to the bases of the second and third switching transistors for supplying a strobe signal thereto and provide the timing in which said pulse signal should be issued.

8. A semiconductor latch circuit according to claim 7 further including a fourth injector transistor which constitutes a fourth integrated injection logic unit jointly with the output leading-out transistor; the collector, emitter and base of the fourth injector transistor being connected respectively to the base of the output leading-out transistor, the power source and the reference potential.

9. A semiconductor latch circuit according to claim 7 further including a second Schottky diode connected between the base of the third switching transistor and the strobe signal input terminal and a third Schottky diode connected between the base of the second switching transistor and the strobe signal input terminal, wherein the second Schottky diode is rendered nonconductive when a pulse supplied to the strobe signal input terminal has a level of "1" and the third Schottky diode becomes nonconductive when a pulse signal supplied to the strobe signal input terminal has a level of "1".

10. A semiconductor latch circuit according to claim 9 further including a fourth injector transistor which constitutes a fourth integrated injector logic unit jointly with the output leading-out transistor; the collector, emitter and base of the fourth injector transistor being connected respectively to the base of the output leading-out transistor, the power source and the reference potential.

11. A semiconductor latch circuit according to claim 7 further including a reset circuit adapted to reset an output signal at the output terminal to a level of "0" and comprised of a fourth integrated injection logic unit formed of a fourth switching transistor and a fourth injector transistor; a fifth integrated injection logic unit formed of a fifth switching transistor and a fifth injector transistor; and a reset terminal supplied with a reset signal; wherein the emitter, collector and base of the fourth switching transistor are connected to the reference potential, the base of the first switching transistor and the collector of the fourth injector transistor, respectively; the emitter, collector and base of the fourth injector transistor being connected to the power source, the base of the fourth switching transistor and the reference potential, respectively; the emitter, collector and base of the fifth injector transistor being connected to the power source, the base of the fifth switching transistor and the reference potential, respectively; the emitter, collector and base of the fifth switching transistor being connected to the reference potential, the base of the second switching transistor and the base of the fourth switching transistor, respectively; and the reset terminal is connected to the base of the fifth switching transistor.

12. A semiconductor latch circuit according to claim 11 further including a sixth injector transistor which constitutes a sixth integrated injection logic unit jointly with the output leading-out transistor; the collector, emitter and base of the sixth injector transistor being connected respectively to the base of the output leading-out transistor, the power source and the reference potential.

13. A semiconductor latch circuit according to claim 11 further including a second Schottky diode connected between the base of the second switching transistor and the strobe signal input terminal, the second Schottky diode being rendered nonconductive when a pulse signal supplied to the strobe signal input terminal has a level of "1".

14. A semiconductor latch circuit according to claim 13 further including a sixth injector transistor which constitutes a sixth integrated injection logic unit jointly with the output leading-out transistor; the collector, emitter and base of the sixth injector transistor being connected respectively to the base of the output leading-out transistor, the power source and the reference potential.

* * * * *

UNITED STATES PATENT AND TRADEMARK OFFICE
CERTIFICATE OF CORRECTION

PATENT NO. : 4065187
DATED : December 27, 1977
INVENTOR(S) : Yasoji Suzuki et al.

It is certified that error appears in the above-identified patent and that said Letters Patent are hereby corrected as shown below:

Claim 1, column 6, line 3, delete "signa" and insert therefor --signal--.

Claim 5, column 6, line 40 after "strobe" insert --signal--.

Claim 9, column 7, line 19 after "pulse" insert --signal--.

Signed and Sealed this

Eleventh Day of April 1978

[SEAL]

Attest:

RUTH C. MASON
*Attesting Officer*

LUTRELLE F. PARKER
*Acting Commissioner of Patents and Trademarks*